United States Patent
Kim (10) Patent No.: US 8,446,769 B2
(45) Date of Patent: May 21, 2013

(54) NONVOLATILE MEMORY DEVICES WITH COMMON SOURCE LINE VOLTAGE COMPENSATION AND METHODS OF OPERATING THE SAME

(75) Inventor: BoGeun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 13/014,237

(22) Filed: Jan. 26, 2011

(65) Prior Publication Data

US 2011/0188310 A1   Aug. 4, 2011

(30) Foreign Application Priority Data

Feb. 1, 2010   (KR) .................. 10-2010-0009251

(51) Int. Cl.
*G11C 11/34* (2006.01)
(52) U.S. Cl.
USPC ............ 365/185.17; 365/185.11; 365/185.18; 365/185.25; 365/189.09
(58) Field of Classification Search
USPC .............. 365/185.18, 185.23, 185.25, 189.09
See application file for complete search history.

(56) References Cited

U.S. PATENT DOCUMENTS

| 5,798,966 | A * | 8/1998 | Keeney .................... | 365/185.18 |
| 6,125,052 | A | 9/2000 | Tanaka | |
| 7,391,646 | B2 * | 6/2008 | Cernea et al. ............ | 365/185.12 |
| 2009/0003077 | A1 | 1/2009 | Lim | |
| 2010/0002507 | A1 * | 1/2010 | Kang et al. ............... | 365/185.03 |

FOREIGN PATENT DOCUMENTS

| JP | 11-096783 | 4/1999 |
| JP | 2002-109890 | 4/2002 |
| KR | 1020080103362 A | 11/2008 |
| KR | 1020090004809 A | 1/2009 |

* cited by examiner

*Primary Examiner* — Pho M Luu
*Assistant Examiner* — Thao Bui
(74) *Attorney, Agent, or Firm* — Myers Bigel Sibley & Sajovec, P.A.

(57) ABSTRACT

A memory device includes a plurality of memory cells serially connected between a bit line and a common source line and a plurality of word lines, respective ones of which are connected to respective gates of the plurality of memory cells. The memory device further includes a common source line compensation circuit configured to generate a compensated bias voltage on the bit line or at least one of the plurality of word lines responsive to a common source line voltage on the common source line. Related methods of operating memory devices are also provided.

11 Claims, 9 Drawing Sheets

NONVOLATILE MEMORY DEVICES WITH COMMON SOURCE LINE VOLTAGE COMPENSATION AND METHODS OF OPERATING THE SAME

CROSS-REFERENCE TO RELATED APPLICATION

This U.S. non-provisional patent application claims priority under 35 U.S.C. §119 of Korean Patent Application No. 10-2010-0009251, filed on Feb. 1, 2010, the entire contents of which are hereby incorporated by reference.

BACKGROUND OF THE INVENTION

The present inventive subject matter herein relates to semiconductor memory devices and methods of operation thereof and, more particularly, to nonvolatile memory devices and methods of operation thereof.

Generally, semiconductor memory devices may be classified as volatile memory devices and nonvolatile memory devices. Volatile memory devices typically lose stored data when not powered, while nonvolatile memory devices typically can maintain stored data even when not powered. Nonvolatile memory devices such as flash memory, ferroelectric RAM (FRAM), magnetic RAM (MRAM) and phase change RAM (PRAM), may include various types of memory cell transistors.

Flash memory devices may be classified as NOR type flash memory devices and NAND flash memory devices according to a cell array structure. In NOR type flash memory devices, memory cell transistors are independently connected to bit lines and word lines. NOR type flash memory device may have superior random access time characteristics. In contrast, in NAND type flash memory devices, a plurality of memory cell transistors is serially connected in a structure referred to as a cell string. Typically, one bit line contact is needed per one cell string. Thus, the NAND type flash memory devices may allow for a higher degree of integration.

Flash memory devices typically include a memory cell array storing data. The memory cell array may include a plurality of memory blocks. Each of the memory blocks may include a plurality of pages. Each of the pages may include a plurality of memory cells. The memory cells may be selectively in "on" and "off" states according to threshold voltage distribution. A cell in an "on" state may be considered an erased cell and a cell in an "off" state may be a programmed cell. Because of structural characteristics, flash memory devices may perform an erase operation by memory block units and perform read or write operations by page units.

Flash memory devices commonly have a cell string structure, wherein a cell string includes a string select transistor (SST) connected to a string select line (SSL), memory cells connected to a plurality of word lines (WL) and a ground select transistor (OST) connected to a ground select line (GSL). The string select transistor (SST) may be connected to a bit line and the ground select transistor (GST) may be connected to a common source line (CSL).

A noise voltage generated on the common source line (CSL) may cause a malfunction of the flash memory devices. For example, although a specific memory cell is not sufficiently programmed (or written), it may be verified as being programmed. Because of the malfunction, when reading the cell after a program operation is finished, the cell may be erroneously read to be a programmed memory cell instead of an erased cell.

SUMMARY OF THE INVENTION

Some embodiments of the inventive subject matter provide a memory device including a plurality of memory cells serially connected between a bit line and a common source line and a plurality of word lines, respective ones of which are connected to respective gates of the plurality of memory cells. The memory device further includes a common source line compensation circuit configured to generate a compensated bias voltage on the bit line or at least one of the plurality of word lines responsive to a common source line voltage on the common source line. In some embodiments, the common source line compensation circuit may generate the compensated bias voltage before a sensing operation in which a program state of the memory cells is determined.

In some embodiments, the common source line compensation circuit may be configured to generate the compensated bias voltage responsive to a common source line voltage on the common source line and an address of the plurality of memory cells. For example, common source line compensation circuit may be configured to store resistance information pertaining to the plurality of memory cells and to generate the bias voltage responsive thereto.

In some embodiments, the plurality of memory cells serially connected between a bit line and a common source line are included in a block of memory cells of a memory cell array including a plurality of blocks of memory cells. Common source lines of the plurality of blocks of memory cells may be electrically connected to one another through at least one of a plurality of metal lines. The common source line compensation circuit may be connected to the plurality of metal lines.

In further embodiments, the common source line compensation circuit includes a common source line detector circuit coupled to the common source line and configured to generate a digital value indicative of the common source line voltage, compensation logic circuit configured to receive the digital value and to generate a bias voltage command signal responsive thereto and a voltage generator circuit configured to generate the compensated bias voltage responsive to the bias voltage command signal. The compensation logic circuit may include a memory configured to store information pertaining to the plurality of memory cells, an arithmetic circuit, and a control circuit configured to cause the arithmetic unit to process the digital value responsive to the information stored in the memory and to generate the bias voltage command signal responsive to the computation. The memory may be configured to store arithmetic information relating a row address of the plurality of memory cells and an amplitude of a common source line voltage.

Additional embodiment provide a memory device including a memory cell array including a plurality of strings of serially-connected memory cells, each of the strings of serially-connected memory cells connected to a common source line and a common source line compensation circuit configured to generate compensated bias voltages on bit lines or word lines of the memory cell array responsive to a common source line voltage on the common source line and addresses of the strings of serially-connected memory cells. The common source line compensation circuit may be configured to store resistance information pertaining to the strings of serially-connected memory cells and to generate the bias voltages responsive thereto. The strings of serially-connected memory cells may be arranged in blocks and common source lines of the blocks may be electrically connected to one another through at least one of a plurality of metal lines. The common source line compensation circuit may be connected to the plurality of metal lines.

In method embodiments, a bit line connected to a selected memory cell is precharged. A voltage is applied to a word line connected to the selected memory cell. A common source voltage of a common source line connected to the selected memory cell is detected. A compensated bias voltage is generated and applied to the bit line or the word line based on the detected common source line voltage. Generating and applying a compensated bias voltage to the bit line or the word line based on the detected common source line voltage and an address of the selected memory cell may include generating and applying a compensated bias voltage to the bit line or the word line based on the detected common source line voltage and an address of the selected memory cell.

BRIEF DESCRIPTION OF THE DRAWINGS

The accompanying drawings are included to provide a further understanding of the inventive subject matter, and are incorporated in and constitute a part of this specification. The drawings illustrate exemplary embodiments of the inventive subject matter and, together with the description, serve to explain principles of the inventive subject matter. In the figures.

DETAILED DESCRIPTION

Some embodiments of the inventive subject matter will be described below in more detail with reference to the accompanying drawings. The embodiments of the inventive subject matter may, however, be embodied in different forms and should not be constructed as limited to the embodiments set forth herein. Rather, these embodiments are provided so that this disclosure will be thorough and complete, and will fully convey the scope of the inventive subject matter to those skilled in the art. Like numbers refer to like elements throughout.

In the drawings, the thickness of layers and regions are exaggerated for clarity. The terminology used herein is for the purpose of describing particular embodiments only and is not intended to be limiting of the invention. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
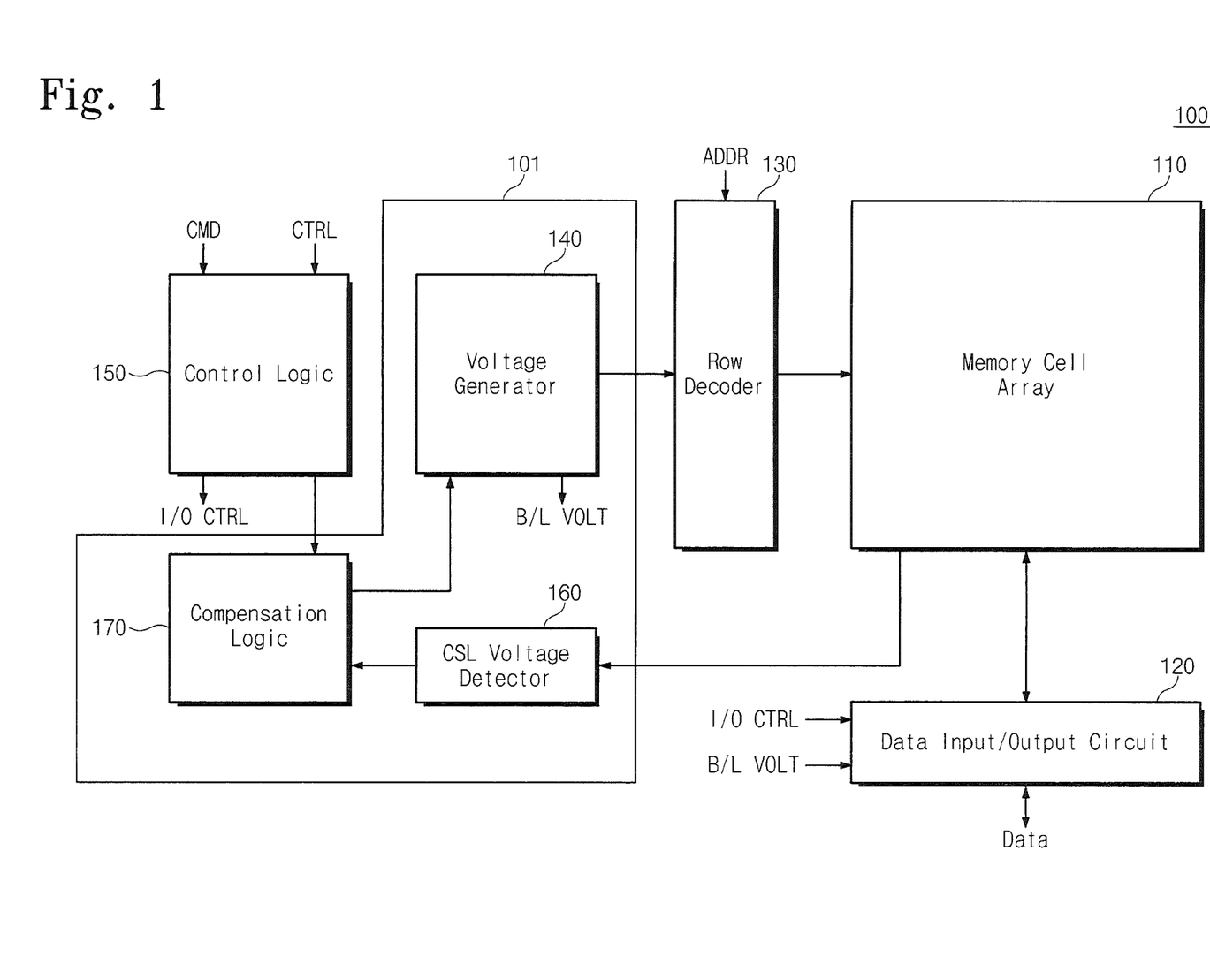
FIG. 1 is a block diagram illustrating a nonvolatile memory device in accordance with some embodiments of the present inventive subject matter.

FIG. 1 is a block diagram illustrating a nonvolatile memory device 100 in accordance with some embodiments of the present inventive subject matter. The nonvolatile memory device 100 may be a NAND type flash memory device. However, the nonvolatile memory device 100 may not be limited to a NAND type flash memory device. For example, the nonvolatile memory device may be constituted a NOR type flash memory device, a phase change RAM, a ferroelectric RAM or a magnetic RAM.

Referring to FIG. 1, the memory device 100 includes a memory cell array 110, a data input/output circuit 120, a row decoder 130 and control logic circuit 150. The memory device 100 further includes a common source line compensation circuit 101 including common source line (CSL) voltage detector circuit 160, compensation logic circuit 170 and a voltage generator 140.

The memory cell array 110 includes memory cells for storing data. A page includes a plurality of cells and a block includes a plurality of pages. The memory device 100 may perform an erase operation by memory block units and may perform read or write operations by page units.

Each memory cell of the memory cell array 110 can store one or more bits of data. A memory cell storing single bit data is called a single level cell (SLC) and a memory cell storing two or more bit data is called a multi level cell (MLC). A single level cell (SLC) has an erase state and one programmed state according to a threshold voltage. A multi level cell (MLC) has an erase state and a plurality of programmed states.

The data input/output circuit 120 is connected to the memory cell array 110 through a plurality of bit lines. The data input/output circuit 120 outputs and inputs data through a data input/output buffer (not illustrated). The data input/output circuit 120 reads out data stored in a selected memory cell among a plurality of memory cells through a bit line. The read data is output to an outside of the flash memory device 100 through the data input/output buffer.

The data input/output circuit 120 also temporarily stores data to be programmed in a selected memory cell. Data stored in the data input/output circuit 120 is programmed in a corresponding memory cell during a program operation. An operation of the data input/output circuit 120 is performed according to a control signal I/O CTRL generated by the control logic circuit 150.

The row decoder 130 is connected to the memory cell array 110 through a plurality of word lines. The row decoder 130 receives an address ADDR to select a block or a page of the memory cell array 110. An address for selecting a block is called a block address and an address for selecting a page is called a page address. A block address and a page address are translated to a row address of the memory cell array 110.

The voltage generator 140 generates a bias voltage to be provided to a bit line or a word line when a read operation or an erase operation is performed. For example, when a read operation is performed, the voltage generator 140 generates a select read voltage $V_{RD}$ to be provided to a selected word line and an unselect read voltage $V_{READ}$ to be provided to an unselected word line. When a program verification operation is performed, the voltage generator 140 generates a program verification voltage $V_{VRF}$ to be provided to the selected word line. When read, write or erase operations are performed, the voltage generator 140 generates a bit line voltage B/L VOLT to be provided to the selected bit line and the unselected bit line. The bit line voltage B/L VOLT is provided to a bit line through the data input/output circuit 120.

The control logic circuit 150 controls operations of the memory device 100 in response to a command CMD and a control signal CTRL from an external device, such as a host, a memory controller or a memory interface. For example, the control logic circuit 150 may control read, write (program) and erase operations of the memory device 100. To achieve this, the control logic circuit 150 controls the data input/output circuit 120, the row decoder 130, the voltage generator 140, the common source line voltage detector circuit 160 and the compensation logic circuit 170.

The common source line voltage detector circuit 160 is connected to a common source line CSL of the memory cell array 110. The common source line voltage detector circuit 160 detects a common source line voltage according to a control of the control logic circuit 150. For example, when a program verification operation or a read operation is performed, the common source line voltage detector circuit 160 may detect a voltage $V_{CSL}$ of the common source line CSL. The detected common source line voltage $V_{CSL}$ can be converted into a digital value by an analog digital converter (ADC).

The compensation logic circuit 170 is connected to the voltage generator 140. The compensation logic circuit 170 compensates the selected word line or the selected bit line with the common source line voltage $V_{CSL}$ responsive to the control logic circuit 150. A bias voltage provided to a word line or a bit line is generated on the basis of a ground of the flash memory device 100. However, a memory cell operates in the basis of the common source line CSL. To reduce a voltage difference between the ground and the common source line CSL, the compensation logic circuit 170 compensates the selected word line or the selected bit line with the common source line voltage $V_{CSL}$.

According to some embodiments of the present inventive subject matter, the common line compensation logic circuit 170 controls the common source line voltage $V_{CSL}$, to be compensated according to the row address. When a program verification operation or a read operation is performed, an "on" cell current flowing through a source of an operating memory cell flows to a ground through the common source line CSL. The "on" cell current may be reduced due to a parasitic resistance. That is, due to a parasitic resistance, a current flowing through a source of an operating memory cell and a current flowing through the common source line may have different values from each other. The parasitic resistance may differ according to the row address. The compensation logic circuit 170 determines the common source line voltage $V_{CSL}$ to be compensated with reference to a parasitic resistance in accordance with the row address. Such operations will be described in detail with reference to FIG. 7.

Figure 2:
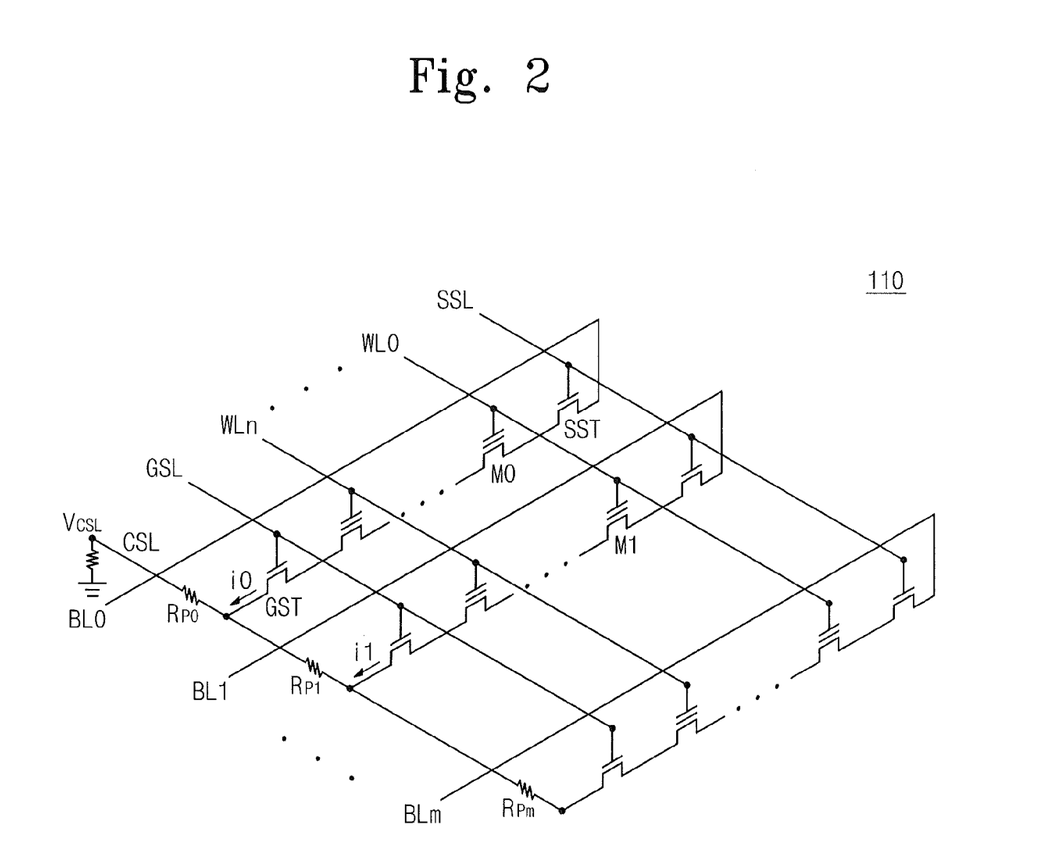
FIG. 2 is a circuit diagram illustrating a memory cell array structure of a flash memory device.

FIG. 2 is a circuit diagram illustrating a memory cell array structure of a flash memory device, for example, a memory block that may be included in the memory cell array 110. The memory cell array 110 may include a plurality of such memory blocks and each of the memory blocks may include a plurality of cell strings.

Each of the cell strings includes a plurality of memory cells connected between a bit line BL and a common source line CSL. Each of the cell strings includes a string select transistor SST connected to a string select line SSL, a plurality of memory cells connected to a plurality of word lines WL0-WLn and a ground select transistor GST connected to a ground select line GSL.

The string select transistor SST is connected to a plurality of bit lines BL0-BLm and the ground select transistor GST is connected to the common source line CSL. Resistances $R_{P0}$-$R_{Pm}$ indicate a resistance of components of the common source line CSL.

When a program verification operation or a read operation is performed, the amount of current flowing through the cell string differs depending on the number of "on" cells. Consequently, the common source line voltage $V_{CSL}$ differs depending on the amount of current flowing thorough the cell string. To check dependence of the common source line voltage $V_{CSL}$ with the number of "on" cells, it may be assumed that a memory cell M0 connected to the selected word line WL0 is in an erase state and a memory cell M1 connected to the selected word line WL0 is in a program state and that, when a memory cell connected to the selected word line WL0 is an "on" cell, currents flowing through cell strings are i0 and i1, respectively.

Based on these assumptions, the voltage of the common source line connected to the selected word line differs depending on the number of "on" cells. For example, if only the memory cell M0 connected to the selected word line WL0 of the bit line BL0 is an "on" cell and the memory cell M1 connected to the selected word line WL0 of the bit line BL1 is an "off" cell, the common source voltage $V_{CSL}$ becomes i0×$R_{P0}$. For another example, if the memory cells M0 and M1 connected to the selected word line WL0 of the bit lines BL0 and BL1 are "on" cells, the common source line voltage $V_{CSL}$ becomes (i0 s $R_{P0}$)+(i1 s $R_{P1}$). This means that, for a read operation or a program verification operation, if the number of "on" cells varies, the common source line voltage $V_{CSL}$ may vary.

Figure 3:
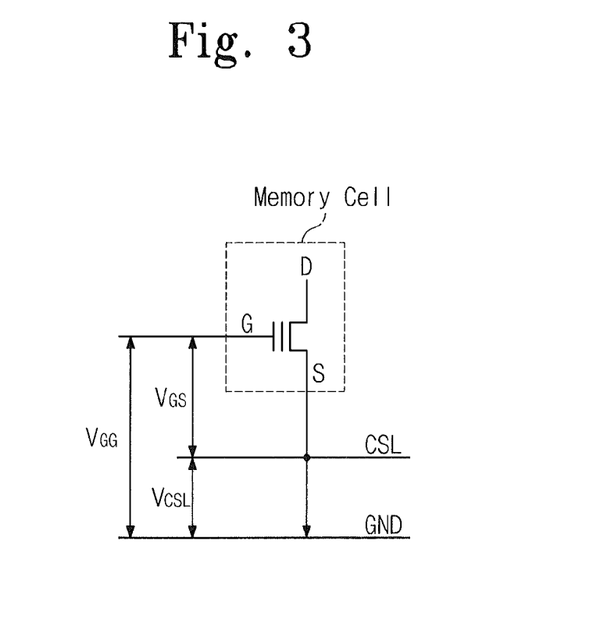
FIG. 3 is a drawing illustrating an error of a threshold voltage of a memory cell.

FIG. 3 is a drawing illustrating a potential error in measuring a threshold voltage of a memory cell caused by variation of a common source line voltage. Referring to FIG. 3, one memory cell included in the memory cell array (110 of FIG. 1) is illustrated by example. When a current flows through the common source line CSL, a voltage change in the voltage $V_{CSL}$ of the common source line CSL may occur due to a parasitic resistance.

A control gate G of the memory cell is controlled by a voltage provided by the voltage generator (140 of FIG. 1). The voltage generator 140 generates a voltage $V_{GG}$ with respect to a ground GND. However, a channel formed during a program verification operation or a read operation of the memory cell is controlled by a voltage difference $V_{GS}$ between the control gate G and a source S of the memory cell. Thus, a voltage difference $V_{CSL}$ is present between the voltage $V_{GG}$ actually provided to the control gate G of the memory cell and the voltage $V_{GS}$ causing channel formation in the memory cell.

The common source line voltage $V_{CSL}$ may generate a detection error in the data input/output circuit (120 of FIG. 1) during a program verification operation or a read operation. The common source line voltage $V_{CSL}$ may depend on an on state or an off state in accordance with data of memory cells. Thus, a level of the common source line voltage $V_{CSL}$ may vary and the common source line voltage $V_{CSL}$ can not be easily removed.

Figure 4:
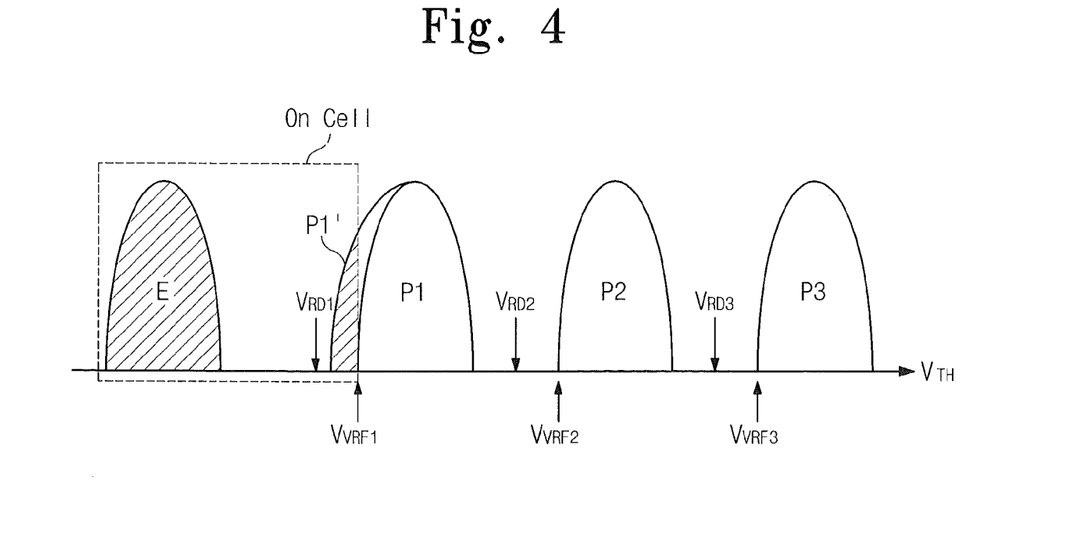
FIG. 4 is a drawing illustrating the number of "on" cells when a program verification voltage is applied to a select word line.

FIG. 4 is a drawing illustrating the number of "on" cells when a program verification voltage is applied to a select word line. Referring to FIG. 4, a threshold voltage distribution of a multi level cell (MLC) storing two or more bit data is illustrated. A memory cell is programmed into one of an erase state E and a plurality of program states P1, P2 and P3. When a read operation is performed, select read voltages $V_{RD1}$, $V_{RD2}$ and $V_{RD3}$ are provided to a selected word line. The first select read voltage $V_{RD1}$ corresponds to a voltage between the erase state E and the first program state P1. The second select read voltage $V_{RD2}$ corresponds to a voltage between the first program state P1 and the second program state P2. The third select read voltage $V_{RD3}$ corresponds to a voltage between the second program state P2 and the third program state P3.

When a program verification operation is performed, program verification voltages $V_{VRF1}$, $V_{VRF2}$ and $V_{VRF3}$ are provided to the selected word line. The first program verification voltage $V_{VRF1}$ is a verification voltage for programming of the memory cell to the first program state P1. The second program verification voltage $V_{VRF2}$ is a verification voltage for programming of the memory cell to the second program state P2. The third program verification voltage $V_{VRF3}$ is a verification voltage for programming of the memory cell to the third program state P3.

When the first program verification voltage VVRF1 is applied, cells distinguished to be "on" are cells having a threshold voltage included in the region indicated by a dashed line. That is, memory cells in the erase state E and memory cells P1' of which threshold voltages are lower than the first program verification voltage $V_{REF1}$ among the cells to be programmed into the first program state P1 may be "on" cells. Although, in FIG. 4, an "on" cell distribution of when a program verification operation for programming the selected memory cell into the first program state P1 is performed is illustrated, "on" cell distributions in the second and third program states P2 and P3 are equally illustrated.

As described in FIG. 2, the common source line CSL is generally connected to a ground terminal through a metal line. Since the metal line has a resistance, a change in the common source line voltage $V_{CSL}$ occurs when current flows through the common source line CSL. The common source line voltage $V_{CSL}$ is in proportion to a cell current due to "on" cells. For example, if the amount of current flowing through the common source line CSL increases because of a lot of "on" cells are connected to the selected word line, the common source line voltage $V_{CSL}$ may increase.

Figure 5:
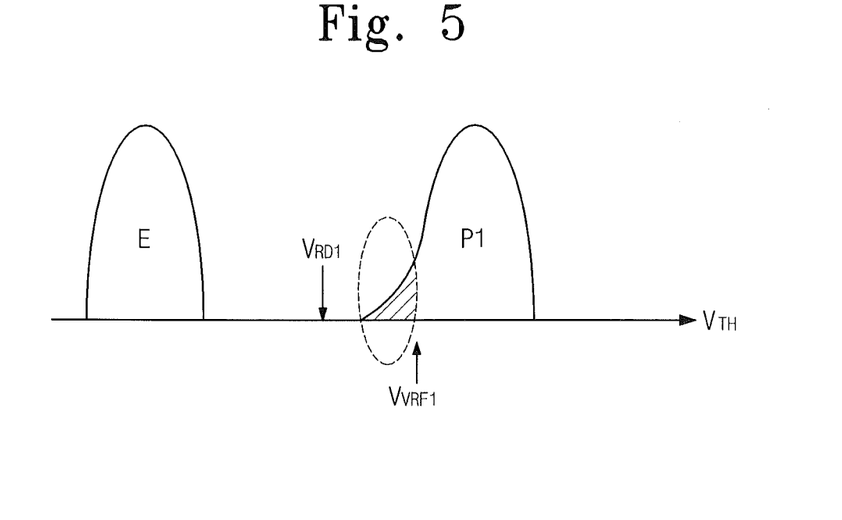
FIG. 5 is a drawing illustrating a threshold voltage distribution of a memory cell affected by a noise voltage present on a common source line.

FIG. 5 is a drawing illustrating a threshold voltage distribution of a memory cell affected by common source line noise voltage. Referring to FIG. 5, a threshold voltage distribution of memory cells which are not sufficiently programmed is illustrated.

As described before, if the number of "on" cells is great when a program verification operation is performed, the amount of current flowing through the common source line CSL may be significant. If a sufficient amount of current flows through the common source line CSL, the common source line voltage $V_{CSL}$ may be relatively high due to a parasitic resistance. If the common source line voltage $V_{CSL}$ is high, the amount of current flowing through the memory cell and detected by the data input/output circuit (120 of FIG. 1) decreases.

If the amount of current which the data input/output circuit (120 of FIG. 1) detects decreases due to in increase in the common source line voltage $V_{CSL}$, it may be erroneously assumed that the threshold voltage of the memory cell is within the bounds of the first program state P1, which may cause termination of the program operation. In other words, although the memory cell is not sufficiently programmed, the memory cell is erroneously considered to be programmed and the program operation halted. This effectively results in a widening of the threshold voltage distribution of the memory device, as indicated by the region defined by the dashed line. After the program operation is completed, memory cells with threshold voltages lower than a first program verification voltage $V_{VRF1}$ may be determined to be cells that are not programmed. This malfunction may also occur for the second and third program states P2 and P3 shown in FIG. 4.

Figure 6:
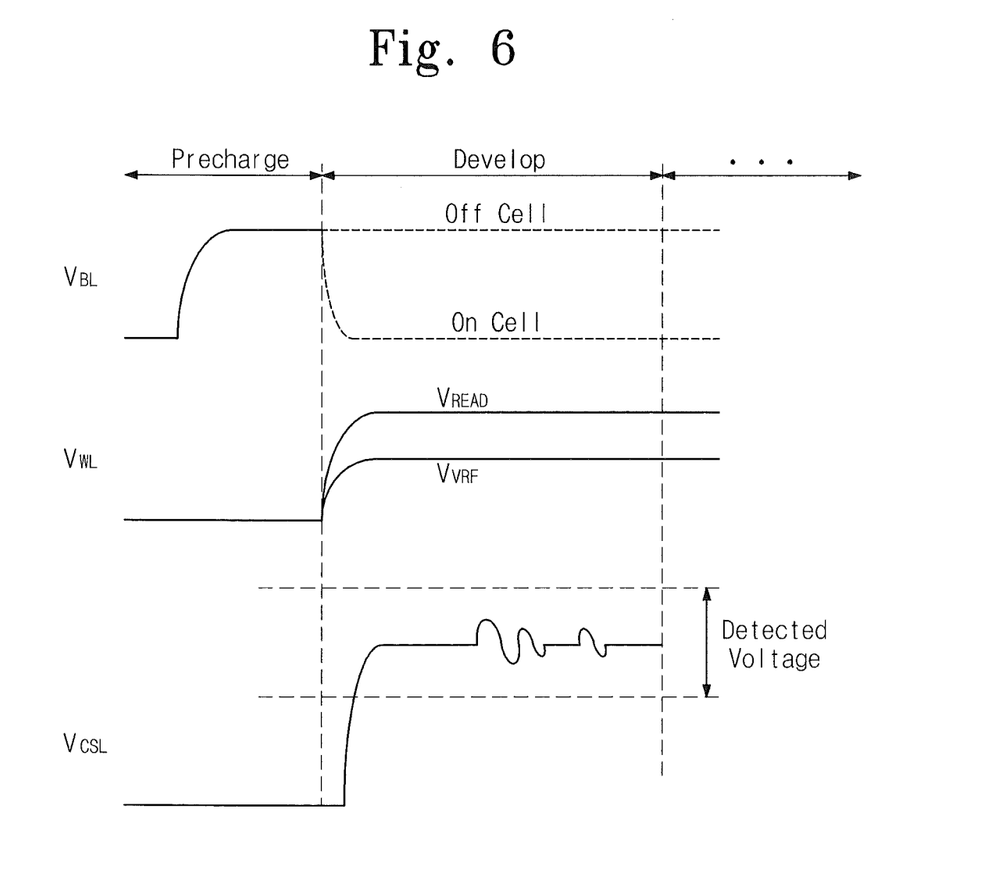
FIG. 6 is a drawing illustrating an operation of a common source line voltage detector circuit in accordance with some embodiments of the present inventive subject matter.

FIG. 6 is a drawing illustrating programming operations of a memory device with a common source line voltage detector circuit in accordance with some embodiments of the present inventive subject matter. Programming operations include programming data into a selected memory cell and verifying the programmed state. The program verification operations include a precharge operation, a development operation, a sensing operation and a discharge operation. The program verification operation may be similar to a read operation.

The common source line voltage detector circuit 160 of FIG. 1 performs a common source line voltage detection operation during the precharge and development operations. In the precharge operation, a selected bit line is precharged to a predetermined voltage. In the development operation, a program verification voltage $V_{VRF}$ is applied to a select word line and an unselect read voltage $V_{READ}$ is applied to an unselected word line. The memory cells are transitioned to an "on" state or an "off" state depending on the program verification voltage $V_{VRF}$ and the unselect read voltage which are applied.

When a memory cell is turned "on" cell by the program verification voltage $V_{REF}$ and the unselect read voltage $V_{READ}$, the precharged selected bit line is discharged. A discharge current forms an "on" cell current through the common source line CSL, generating a common source line voltage $V_{CSL}$. The common source line voltage detector circuit 160 is connected to the common source line CSL of the memory cell array. Thus, during the precharge and development operations, the common source line voltage detector circuit 160 detects the common source line voltage $V_{CSL}$ under control of the control logic circuit 150 of FIG. 1.

Referring to FIG. 1 in conjunction with FIG. 6, the common source line voltage detector circuit 160 includes an analog digital converter (ADC). The detected common source line voltage $V_{CSL}$ is converted into a digital value by the ADC and the digital value is provided to the compensation logic circuit 170.

Figure 7:
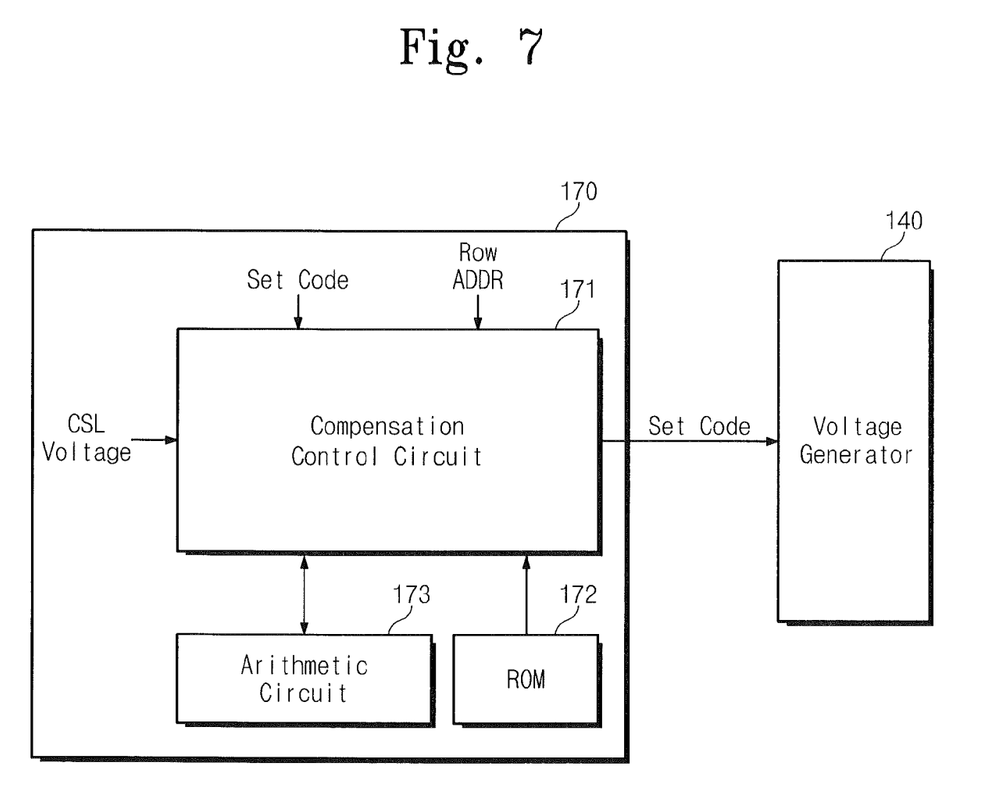
FIG. 7 is a block diagram illustrating common source line compensation logic in accordance with some embodiments of the present inventive subject matter.

FIG. 7 is a block diagram illustrating compensation logic circuit 170 in accordance with some embodiments of the present inventive subject matter. The compensation logic circuit 170 includes a compensation control circuit 171, a ROM 172 and an arithmetic circuit 173.

The compensation control circuit 173 receives the digital value representing the common source line voltage from the common source line voltage detector circuit 160 of FIG. 1. The compensation control circuit 171 receives a set code and a row address from the control logic circuit 150 of FIG. 1. The set code is a control signal that the control logic circuit 150 generates to control an output voltage of the voltage generator 140, i.e., the set code determines a level of a bias voltage provided to a selected word line or a bias voltage provided a selected bit line that the voltage generator 140 generates. The row address includes a block address for selecting a block and a page address for selecting a page.

The compensation control circuit 171 decodes the row address received from the control logic circuit 150. The compensation control circuit 171 loads information corresponding to the decoded row address from the ROM 172. Arithmetic data about each of the row addresses is stored in the ROM 172. The stored arithmetic data may include, for example, a resistance ratio of a node detecting the common source line voltage $V_{CSL}$ to a source node corresponding to each of the row addresses, a back bias characteristic of a memory cell, a common source line characteristic depending on a temperature change, and a common source line characteristic depending on a voltage change are stored in the ROM 172.

The common source line voltage $V_{CSL}$, as illustrated in FIG. 6, may have a ripple shape during the development operation. The compensation control circuit 171 judges whether the common source line voltage $V_{CSL}$ is within a predetermined voltage range. The compensation control circuit 171 treats the common source line voltage $V_{CSL}$ within the predetermined range as having an average common source line voltage. For example, if the common source line voltage $V_{CSL}$ ripples between 100 mV and 200 mV, the compensation control circuit 171 treats the common source line $V_{CSL}$ as having an average value of 150 mV.

The compensation control circuit 171 determines a common source line compensation voltage $V_{CPS}$ to be applied to the selected word line or the selected bit line based on arithmetic information on a loaded row address and the input common source line voltage $V_{CSL}$. For example, the compensation control circuit 171 operates an increase or a decrease of the input common source line voltage $V_{CSL}$ using the arithmetic information on a loaded row address. The operation is performed through the arithmetic circuit 173. The arithmetic circuit 173 includes an adder, a subtractor, a multiplier and a divider.

When a common source line compensation voltage $V_{CPS}$ is determined, the compensation control circuit 171 provides a control signal to the voltage generator 140. For example, the compensation control circuit 171 may provide a new set code so that a voltage that the common source line compensation voltage $V_{CPS}$ is added to the input select word line voltage. The voltage generator 140 generates a bias voltage on the selected word line or the selected bit line according to the new set code.

The compensation operation by the compensation logic circuit 170 occurs before the development operation terminates. Thus, a compensated voltage is provided to the selected word line or the selected bit line for operations after the development operation, for example, a sensing operation in which it is determined whether the selected memory cell is programmed.

Figure 8:
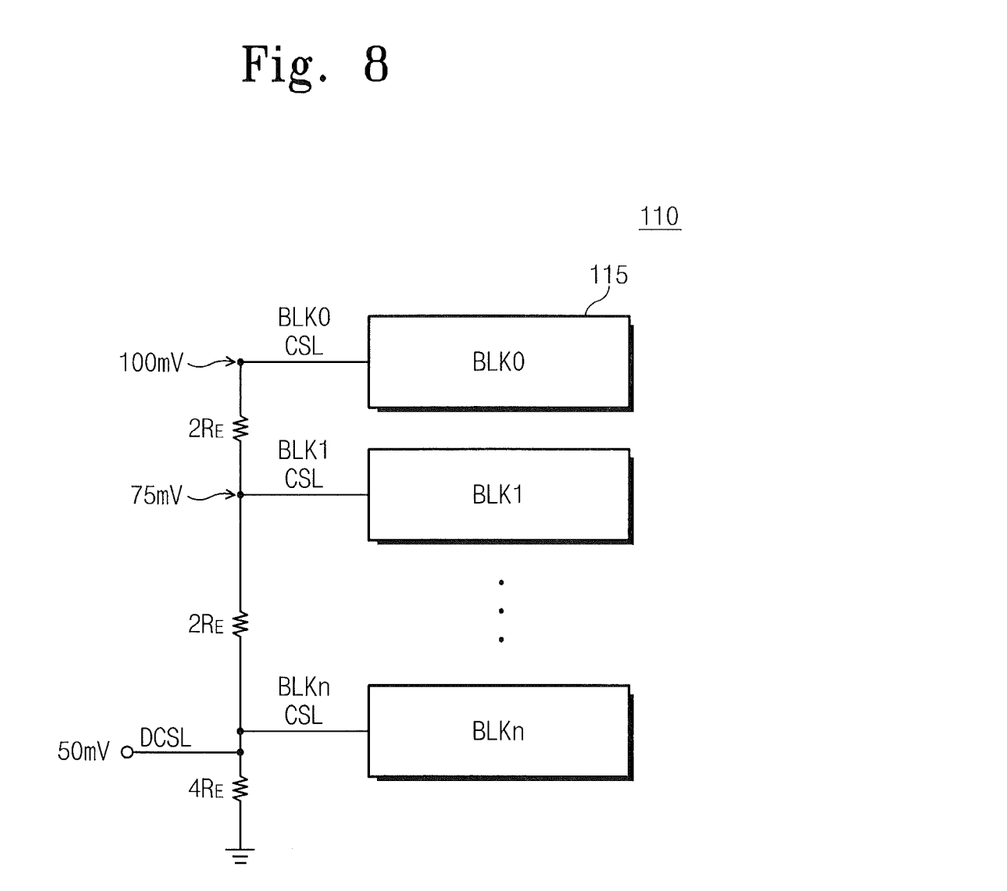
FIGS. 8 and 9 are drawings illustrating operations of common source line compensation logic in accordance with some embodiments of the present inventive subject matter.
Figure 9:
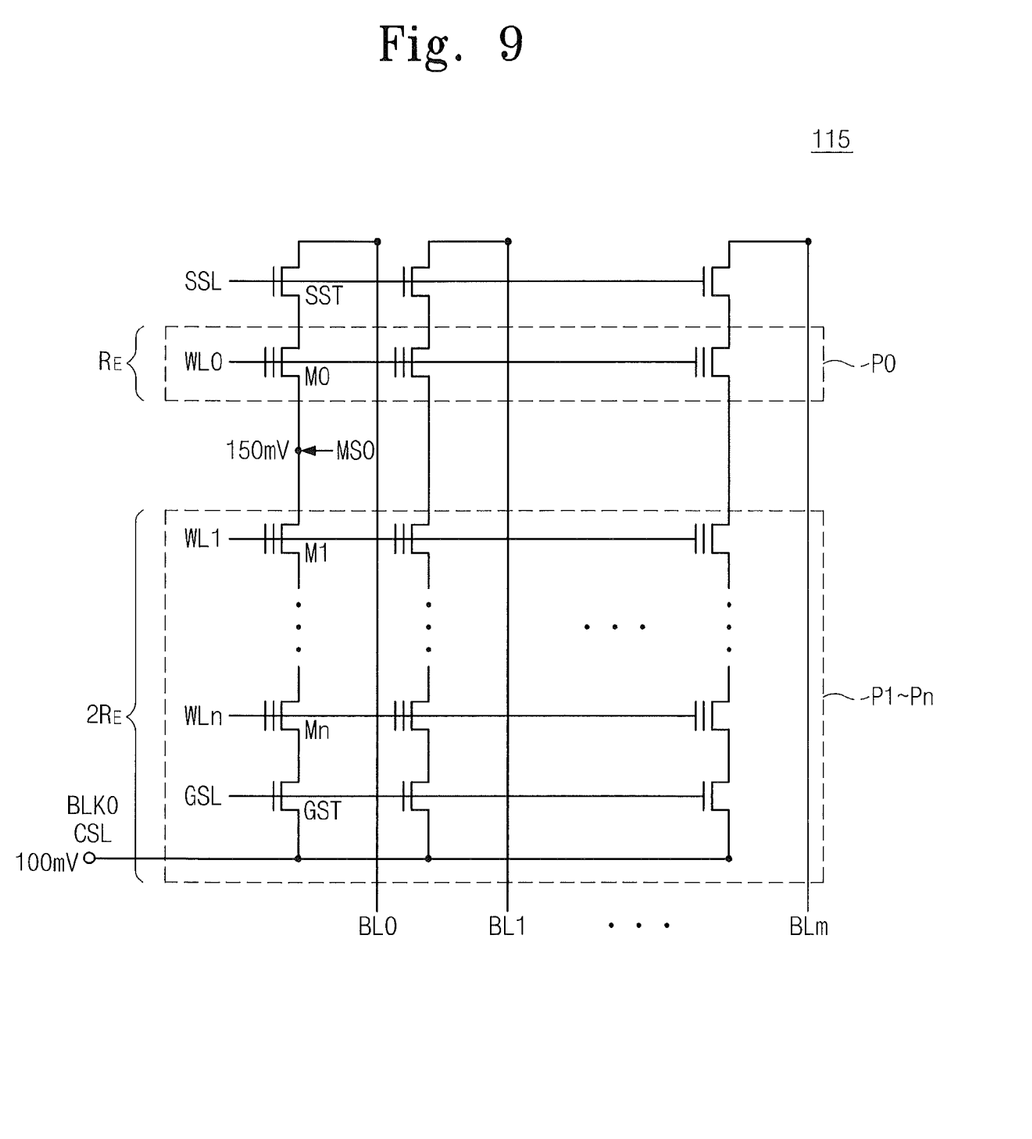

FIGS. 8 and 9 are drawings illustrating operations of compensation logic circuit in accordance with some embodiments of the present inventive subject matter. A plurality of blocks BLK0-BLKn of a memory cell array 110 is illustrated. Each of the blocks BLK0-BLKn includes a common source line CSL to which a plurality of cell strings is connected. The common source lines CSL are connected to one another. Although not illustrated in the drawings for convenience of description, the common source lines CSL may be connected to one another through a plurality of metal lines having a mesh structure. The common source lines CSL are connected to a ground node through a common source line driver (not illustrated).

Referring to FIGS. 1, 7 and 8, the common source line voltage detector circuit 160 of FIG. 1 detects a common source line voltage $V_{CSL}$ a detection node DCSL. The detection node DCSL may be at any place among the connected common source lines CSL. According to some embodiments of the present inventive subject matter, the detection node DCSL is positioned between the ground node and the common source line CSL of the block BLKn nearest to the ground node. A common source line voltage $V_{CSL}$ detected at the detection node DCSL is provided to the compensation logic circuit 170.

In the example described below, an address of a page P0 of the block BLK0 is input into the compensation logic circuit 170 as a row address and a voltage of 50 mV is input into the compensation logic circuit 170 as the common source line voltage $V_{CSL}$. The compensation control circuit 171 loads an input row address, that is, arithmetic information corresponding to the page 0 of the block BLK0 from the ROM 172. The loaded arithmetic information indicates a resistance ratio of the detection node DCSL to a node MS0 of the page 0 of the block BLK0. Here, the node MS0 is located at a source of a memory cell M0. The resistance ratio may be a value that is calculated or measured considering a parasitic resistance which exists in each common source line. The resistance ratio may also be a value that is calculated or measured considering a parasitic resistance which exists in metal lines connecting common source lines. The resistance ratio may also be a value that is calculated or measured considering a parasitic resistance which exists in memory cells. In FIGS. 8 and 9, the resistance ratio is illustrated using an equivalent resistance $R_E$.

The compensation control circuit 171 determines a common source line compensation voltage $V_{CPS}$ with reference to the input common source line voltage $V_{CSL}$ and loaded arithmetic information. The arithmetic operation is performed by the arithmetic circuit 173. The common source line compensation voltage $V_{CPS}$ may be determined according to voltage divider law as follows:

$$50 \text{ mV} = V_{CPS} \times \frac{2R_E}{R_E + 2R_E} \times \frac{4R_E}{2R_E + 2R_E + 4R_E}$$

Here, the numerical formula $V_{CPS} \times (2R_E/R_E+2R_E)$ is a voltage value at the common source line CSL of the block BLK0 and has a value of 100 mV. The common source line compensation voltage $V_{CPS}$ is a voltage value at the node MS0 of the page P0 of the block BLK0 and has a value of 150 mV.

A resistance ratio of a node where the common source line voltage is detected to a source node of selected memory cell is stored in the ROM 172. In other embodiments, a mathematical formula which can be used to determine a voltage of a source node of a memory cell by an input common source line voltage $V_{CSL}$ may be stored in the ROM 172. A row address and arithmetic information about the plurality of common source line voltages $V_{CSL}$ are stored in the ROM 172. The ROM 172 may include, for example, a nonvolatile memory device, such as a flash memory device, FRAM, MRAM or PRAM.

If the common source line compensation voltage $V_{CPS}$ is determined to be 150 mV, the compensation control circuit 171 controls the voltage generator 140 so that a bias voltage is provided to the selected word line or the selected bit line that reflects the common source line compensation voltage $V_{CPS}$. That is, the compensation control circuit 171 controls the voltage generator 140 so that a bias voltage to which 150mV has been added is provided to the selected word line or the selected bit line.

According to some embodiments of the present inventive subject matter, the compensation logic circuit 170 compensates a bias voltage provided to the selected word line or the selected bit line to compensate for a noise voltage of the common source line. The compensation may vary according to the row address. When a program verification operation or a read operation is performed, an "on" cell current flowing through source of an operating memory cell is reduced while flowing into the ground through the common source line. The common source lines and parasitic resistances which exist in memory cells may become a cause of a reduction of an "on" cell current. Thus, when a program verification operation or a read operation is performed, the compensation logic circuit 170 compensates a bias voltage provided to the selected word line or the selected bit line responsive to the voltage of the common source line so that the "on" cell current of before it is reduced flows through the selected memory cell.

Figure 10:
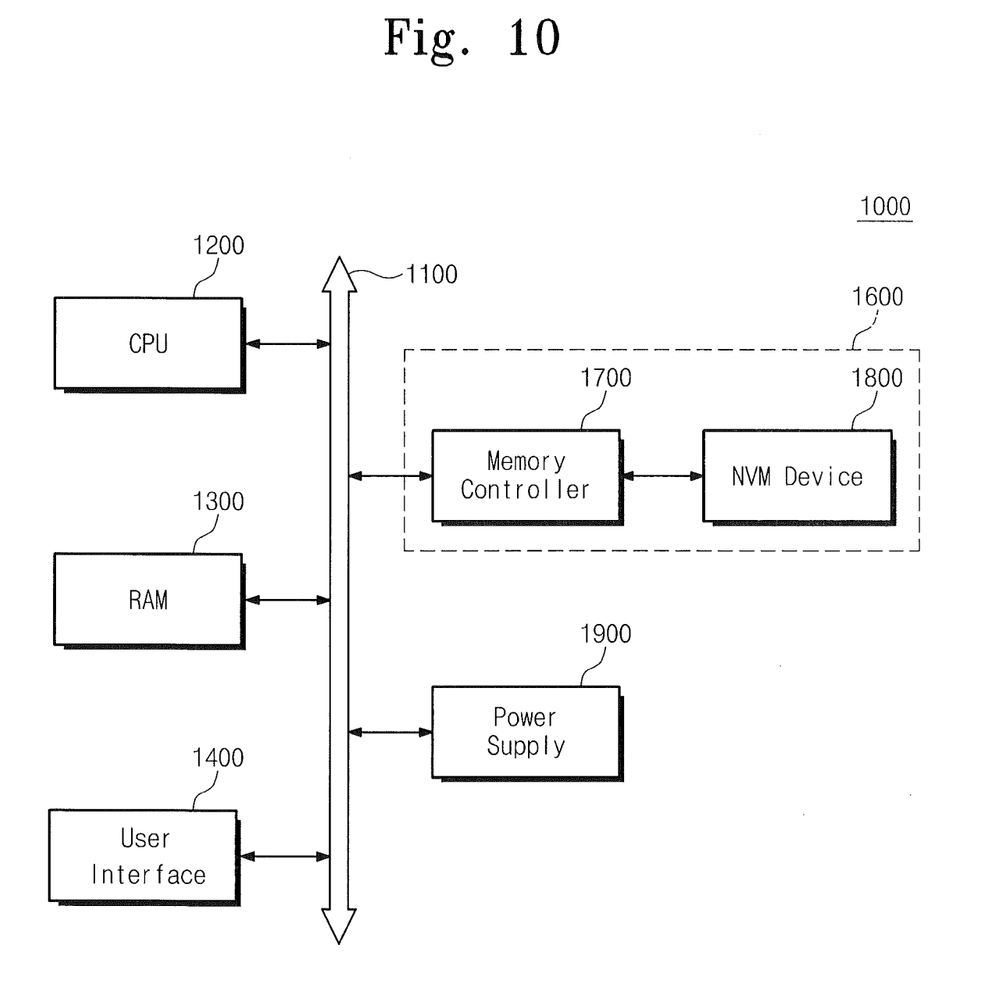
FIG. 10 is a block diagram illustrating a user device including a flash memory device in accordance with some embodiments of the present inventive subject matter.

FIG. 10 is a block diagram illustrating a user device including a flash memory device in accordance with some embodiments of the present inventive subject matter. Referring to FIG. 10, a user device 1000 includes a system bus 1100, a central processing unit 1200, a random access memory (RAM) 1300, a user interface 1400, a data storage device 1600 and a power supply 1900.

The data storage device 1600 is electrically connected to the user device 1000 through the system bus 1100. The data storage device 1600 includes a memory controller 1700 and a nonvolatile memory device 1800. The data storage device 1600 may include a plurality of nonvolatile memory devices. Data provided by the user interface 1400 or processed by the central processing unit 1200 may be stored in the nonvolatile memory device 1800 through the memory controller 1700. Data stored in the nonvolatile memory device 1800 is provided to the central processing unit 1200 or to the user interface 1400 through the memory controller 1700. The nonvolatile memory device 1800 may include common source line voltage compensation along the lines discussed above.

The RAM 1300 is used as a working memory of the central processing unit 1200. The power supply 1900 provides a working power to the user device 1000. For example, the power supply 1900 is constituted by a power supply device such as a battery. Although not illustrated in the drawing, the user device 1000 may further include an application chipset, a camera image processor or the like.

Figure 11:
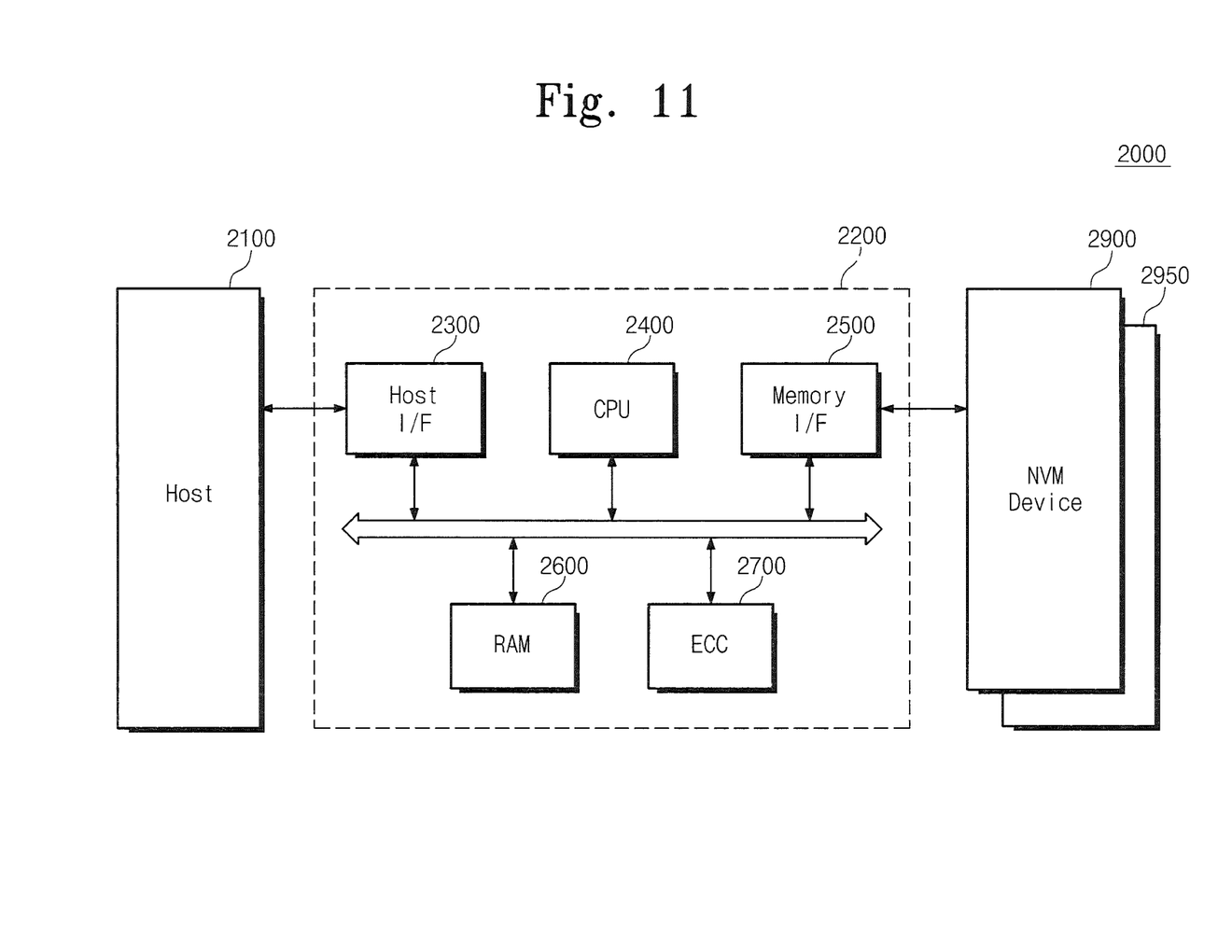
FIG. 11 is a block diagram illustrating a memory system including a flash memory device in accordance with some embodiments of the present inventive subject matter.

FIG. 11 is a block diagram illustrating a memory system including a flash memory device in accordance with some embodiments of the present inventive subject matter. Referring to FIG. 11, a memory system 2000 includes a memory controller 2200 and a nonvolatile memory device. The memory system 2000 may include a plurality of nonvolatile memory devices. The memory system 2000 in accordance with some embodiments of the present inventive subject matter includes two nonvolatile memory devices 2900 and 2950, which may include common source line voltage compensation along the lines discussed above.

The memory controller 2200 is connected to a host 2100 and the nonvolatile memory device 2900. The memory controller 2200 is configured to access the nonvolatile memory device 2900 in response to a request of the host 2100. For example, the memory controller 2200 is configured to control a read, a write and an erase of the nonvolatile memory device 2900. The memory controller 2200 is configured to provide an interface between the nonvolatile memory device 2900 and the host 2100. The memory controller 2200 is configured to drive a firmware for controlling the nonvolatile memory device 2900.

The memory controller 2200 may include constituent elements such as a RAM, a CPU, a host interface, an error correction code (ECC) and a memory interface. A RAM 2600 may be used as a working memory of the central processing unit (CPU) 1400. The CPU 1400 controls the whole operations of the memory controller 2200.

A host interface 2300 may include a protocol for performing a data exchange between the host 2100 and the memory controller 2200. For example, the memory controller 2200 may be configured to communicate with the outside (for example, a host) through one of various protocols such as an universal serial bus (USB) protocol, a multimedia card (MMC) protocol, a peripheral component interconnection (PCI) protocol, a PCI-express (PCI-E) protocol, an advanced technology attachment (ATA) protocol, a serial ATA (SATA) protocol, a small computer small interface (SCSI) protocol, an enhanced small disk interface (ESDI) protocol and an integrated drive electronics (IDE) protocol.

An error correction block 2700 may be configured to detect and correct data read from the nonvolatile memory device 2900. The error correction block 2700 may be provided as a constituent element of the memory controller 2200. The error correction block 2700 may be provided as a constituent element of the nonvolatile memory device 2900. A memory interface 2500 can interface with the nonvolatile memory device 2900 and the memory controller 2200.

The constituent elements of the memory system 2000 may not be limited to the constituent elements described above. For example, the memory system 2000 may further include needed code data for an initial booting operation and a read only memory (ROM) storing data for an interfacing. The memory system 2000 may also further include a power supply device such as a battery to easily carry the memory system 2000.

The memory controller 2200 and the nonvolatile memory device 2900 are integrated in one semiconductor device to constitute a memory card. For example, the memory controller 2200 and the nonvolatile memory device 2900 are integrated in one semiconductor device to constitute a personal computer memory card international association (PCMCIA) card, a compact flash (CF) card, a smart media card, a memory stick, a multimedia card (MMC, RS-MMC, MMC-micro), a secure digital (SD) card (SD, Mini-SD, Micro-SD, SDHC), an universal flash storage and so on.

The memory system 2000 may be applied to a solid state drive (SSD), a computer, a portable computer, an ultra mobile personal computer, a work station, a net book, a personal digital assistant (PDA), a web tablet, a wireless phone, a mobile phone, a digital camera, a digital audio recorder, a digital audio player, a digital video recorder, a digital video player, a device that can transmit and receive data in a wireless environment, one of various electronic devices constituting a home network, one of various electronic devices constituting a computer network, one of various electronic devices constituting a telematics network, one of various constituent elements constituting a computer system, a radio frequency identification device (RFID) or an embedded system.

The nonvolatile memory device 2900 or the memory system 2000 may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The nonvolatile memory device in accordance with the present inventive subject matter can limit distortion of threshold voltage distribution of memory cells clue to the noise voltage of the common source line during a program operation.

The above-disclosed subject matter is to be considered illustrative, and not restrictive, and the appended claims are intended to cover all such modifications, enhancements, and other embodiments, which fall within the true spirit and scope of the inventive subject matter. Thus, to the maximum extent allowed by law, the scope of the inventive subject matter is to be determined by the broadest permissible interpretation of the following claims and their equivalents, and shall not be restricted or limited by the foregoing detailed description.

What is claimed is:

1. A memory device comprising:
   a plurality of memory cells serially connected between a bit line and a common source line;
   a plurality of word lines, respective ones of which are connected to respective gates of the plurality of memory cells; and
   a common source line compensation circuit configured to generate a compensated bias voltage on the bit line or at least one of the plurality of word lines responsive to a common source line voltage on the common source line, wherein the common source line compensation circuit comprises:
      a common source line detector circuit coupled to the common source line and configured to generate a digital value indicative of the common source line voltage;
      a compensation logic circuit configured to receive the digital value and to generate a bias voltage command signal responsive thereto; and
      a voltage generator circuit configured to generate the compensated bias voltage responsive to the bias voltage command signal, wherein the compensation logic circuit comprises:
         a memory configured to store information pertaining to the plurality of memory cells;
         an arithmetic circuit; and
         a control circuit configured to cause the arithmetic unit to process the digital value responsive to the information stored in the memory and to generate the bias voltage command signal responsive to the computation.

2. The memory device of claim 1, wherein the common source line compensation circuit is configured to generate the compensated bias voltage responsive to the common source line voltage on the common source line and an address of the plurality of memory cells.

3. The memory device of claim 1, wherein the common source line compensation circuit is configured to store resistance information pertaining to the plurality of memory cells and to generate the bias voltage responsive thereto.

4. The memory device of claim 1:
   wherein the plurality of memory cells serially connected between the bit line and the common source line are included in a block of memory cells of a memory cell array comprising a plurality of blocks of memory cells and wherein common source lines of the plurality of blocks of memory cells are electrically connected to one another through at least one of a plurality of metal lines; and
   wherein the common source line compensation circuit is connected to the plurality of metal lines.

5. The memory device of claim 1, wherein the common source line compensation circuit generates the compensated bias voltage before a sensing operation in which a program state of the memory cells is determined.

6. The memory device of claim 1, wherein the common source line compensation circuit is configured to determine an average common source line voltage and to generate the bias voltage responsive to the determined common source line voltage.

7. The memory device of claim 1, wherein the memory is configured to store arithmetic information relating a row address of the plurality of memory cells and an amplitude of the common source line voltage.

8. The memory device of claim 1, wherein the bias voltage command signal comprises a set code.

9. A memory device comprising:
   a memory cell array comprising a plurality of strings of serially-connected memory cells, each of the strings of serially-connected memory cells connected to a common source line; and
   a common source line compensation circuit configured to generate compensated bias voltages on bit lines or word lines of the memory cell array responsive to a common source line voltage on the common source line and addresses of the strings of serially-connected memory cells, wherein the common source line compensation circuit comprises:
      a common source line detector circuit coupled to the common source line and configured to generate a digital value indicative of the common source line voltage;
      a compensation logic circuit configured to receive the digital value and to generate a bias voltage command signal responsive thereto; and
      a voltage generator circuit configured to generate the compensated bias voltage responsive to the bias voltage command signal, wherein the compensation logic comprises:
         a memory configured to store information pertaining to the plurality of memory cells;
         an arithmetic circuit; and
         a control circuit configured to cause the arithmetic unit to process the digital value responsive to the information stored in the memory and to generate the bias voltage command signal responsive to the computation.

10. The memory device of claim 9, wherein the common source line compensation circuit is configured to store resistance information pertaining to the strings of serially-connected memory cells and to generate the bias voltages responsive thereto.

11. The memory device of claim 9:
   wherein the strings of serially-connected memory cells are arranged in blocks and wherein common source lines of the blocks are electrically connected to one another through at least one of a plurality of metal lines; and wherein the common source line compensation circuit is connected to the plurality of metal lines.

* * * * *